United States Patent
Ker et al.

[11] Patent Number: 6,011,681
[45] Date of Patent: Jan. 4, 2000

[54] WHOLE-CHIP ESD PROTECTION FOR CMOS ICS USING BI-DIRECTIONAL SCRS

[75] Inventors: Ming-Dou Ker; Hun-Hsien Chang, both of Hsin-Chu, Taiwan

[73] Assignee: Taiwan Semiconductor Manufacturing Company, Ltd., Hsin-Chu, Taiwan

[21] Appl. No.: 09/140,385

[22] Filed: Aug. 26, 1998

[51] Int. Cl.[7] ...................................... H02H 3/22
[52] U.S. Cl. .............................. 361/111; 361/56; 361/91.5
[58] Field of Search ........................... 361/56, 91.1, 91.2, 361/91.5, 91.8, 111

[56] References Cited

U.S. PATENT DOCUMENTS

| | | | |
|---|---|---|---|
| 5,392,185 | 2/1995 | Haas, Jr. et al. | 361/56 |
| 5,530,612 | 6/1996 | Maloney | 361/56 |
| 5,719,733 | 2/1998 | Wei et al. | 361/56 |
| 5,754,381 | 5/1998 | Ker | 361/56 |

*Primary Examiner*—Michael J. Sherry
*Attorney, Agent, or Firm*—Tung & Associates

[57] ABSTRACT

CMOS VLSI chips with pin counts greater than 100 often have multiple power pins to supply sufficient current for circuit operations. In mixed voltage ICs there are separated power pins with different power supplies for specified power operations, and in these ICs the power supplies for the digital and analog circuits are often separated due to noise considerations. In such ICs with separated power pins, the interface circuits between the circuits with different power pins are vulnerable to ESD (electrostatic discharge) stress. Even though there are suitable ESD protection circuits around the input and output pins of the IC, unexpected ESD damage still happens to the interface circuits between the circuits with different power pins, so that a whole-chip ESD protection arrangement using bi-directional SCRs is provided to protect the CMOS ICs against ESD damage. The bi-directional SCRs are placed between the separated power lines of the CMOS IC to provide ESD current discharging paths between the separated power lines. Thus, the vulnerable internal circuits and interface circuits between the different power pins are rendered remote from the ESD damage. The present ESD protection arrangement can be applied to chips having multiple or mixed-voltage power pins.

16 Claims, 12 Drawing Sheets

WHOLE-CHIP ESD PROTECTION FOR CMOS ICS USING BI-DIRECTIONAL SCRS

BACKGROUND OF THE INVENTION

1. Field of the Invention

The present invention generally relates to electrostatic discharge (ESD) protection for integrated circuits (ICs) and, more particularly, to a bi-directional, silicon-controlled rectifier (SCR) arrangement connected between separated power lines of a metal-oxide-semiconductor (MOS) IC to achieve whole-chip ESD protection.

2. Prior Art

As more circuits and functions are integrated into a single semiconductor chip, the chip often needs more power pins to supply sufficient current for circuit operations. For example, a 208-pin CMOS VLSI (very large scale integration) chip may have more than 20 power pins. On the other hand, in mixed mode ICs, the analog power pins are often separated from those of the digital circuits to de-couple the noise from the digital circuits to the analog circuits. Thus, in high performance or high integration CMOS ICs, the power pins of an IC are often separated into many pairs to supply sufficient current for circuit operations or to de-couple noise for better circuit performance. To protect such CMOS ICs with separated power pins and separated power lines from ESD damage in the chip, ESD protection circuits are typically placed around the input and output pads of the IC. However, it has been reported that the interface circuits are more sensitive to ESD damage, even with suitable ESD protection circuits placed around the input and output pads of the IC (see, e.g., M.-D. Ker et al, 1) "ESD protection to overcome internal gate-oxide damage on digital-analog interface of mixed-mode CMOS ICs," *Journal of Microelectronics and Reliability*, vol.36, no. 11/12, pp. 1727–1730; 2) "Whole-chip ESD protection for CMOS VLSI/ULSI with multiple power pins," *Proc. of* 1994 *IEEE International Integrated Reliability Workshop*, USA, Oct. 16–19, 1994, pp.124–128; and 3) "Whole-chip ESD protection scheme for CMOS mixed-mode ICs in deep-submicron CMOS technology," *Proc. of IEEE Custom Integrated Circuits Conference*, Santa Clara, Calif., USA, May 5–8, 1997, pp.31–34).

In addition to the power pins, ESD stress may happen across any two pins of a CMOS IC. The ESD current may enter into the IC through an input pin, and then go out the IC from another input pin or an output pin. So, in the ESD testing standard, i.e., EOS/ESD *Standard for ESD Sensitvity Testing*, EOS/ESD Association, Inc, N.Y., 1993, pin-to-pin ESD stress has been specified as an ESD-testing condition. In this standard pin-to-pin ESD testing of a chip, positive or negative ESD voltages are applied to one input pin and the other input and output pins are grounded, while the VDD and VSS power pins are floating. This pin-to-pin ESD-testing condition often causes some unexpected ESD damage on the internal circuits lying beyond the input or output ESD protection circuits.

Figure 1:
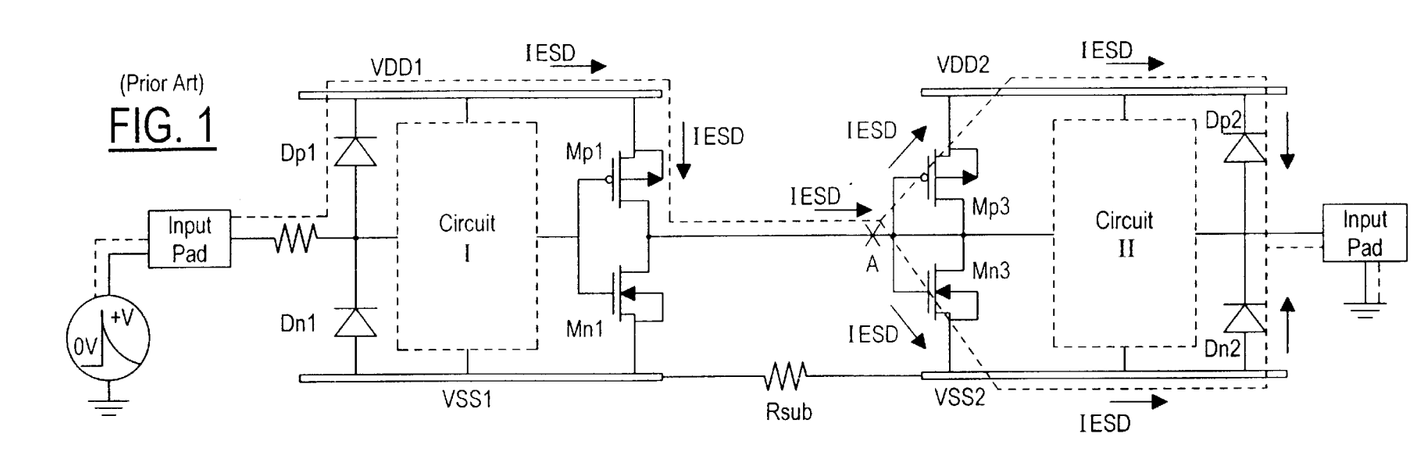
FIG. 1 is a schematic circuit diagram illustrating a prior art CMOS IC, with separated power pins, comprising two circuits, Circuit I and Circuit II, arranged for standard pin-to-pin ESD testing, with a positive ESD voltage applied to one input pin of Circuit I, an input pin of Circuit II relatively grounded, and VDD1, VSS1, VDD2, and VSS2 power lines all floating, and showing the ESD current discharging path by the dashed lines whereby damage may occur through the node "A" to the interface circuits between the separated power lines.
Figure 2:
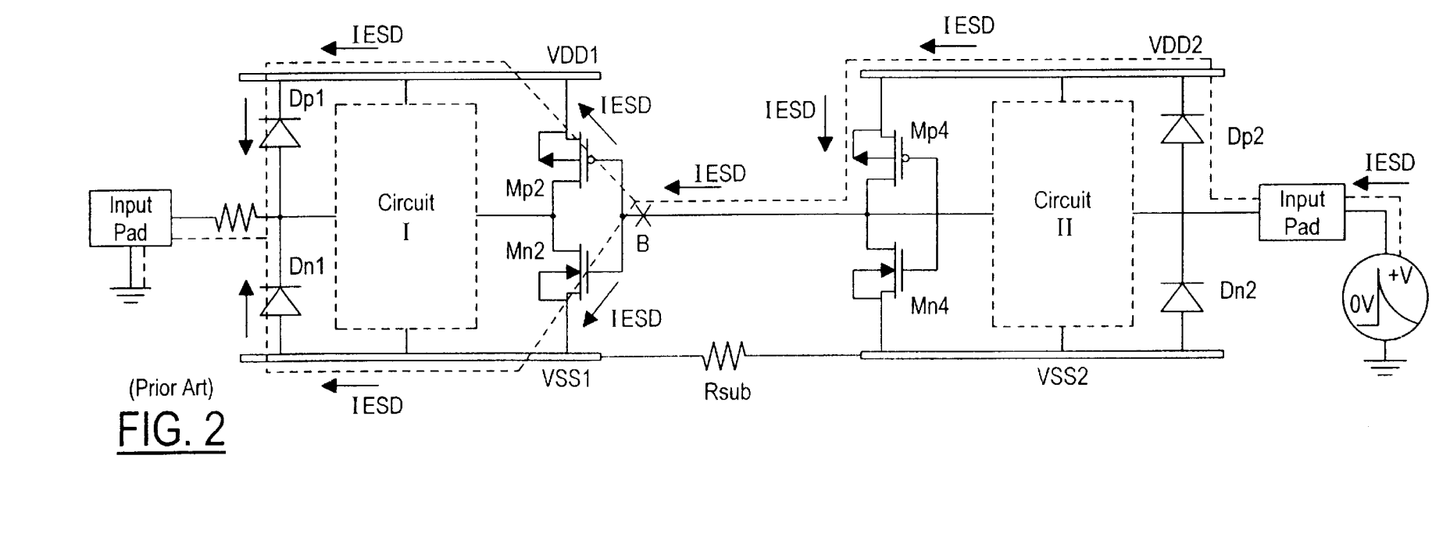
FIG. 2 is a schematic circuit diagram as in FIG. 1 illustrating the ESD current discharging path when the ESD voltage is attached to one input pin of Circuit II and an input pin of the Circuit I is relatively grounded, and showing the ESD voltage is diverted into the VDD2 power line and then goes to the node "B" through the Mp4 device of the interface circuits between the Circuits I and II.

To explain the ESD damage that may occur due to such pin-to-pin ESD stress on a CMOS IC, attention is called to the schematic diagram in FIG. 1, wherein the CMOS IC has two circuits, Circuit I and Circuit II, and a positive ESD voltage is applied to one input pin of Circuit I and an input pin of Circuit II is relatively grounded. In standard pin-to-pin ESD testing, the VDD1, VSS1, VDD2, and VSS2 power lines are all floating. Circuit I has power supplies VDD1 and VSS1, and Circuit II has power supplies VDD2 and VSS2, but, VDD1 is separated from VDD2 and VSS1 is separated from VSS2. Circuits I and II are connected by some interface circuits to transfer the signal message between them in the CMOS IC. This is a typical CMOS IC having two pairs of separated power supply pins. As shown in FIG. 1, when an ESD current, IESD, occurs, it is diverted into the VDD1 power line through the diode Dp1 in the input ESD protection circuit of Circuit I. The ESD current in the VDD1 power line may then flow into the interface circuit through the Mp1 device, at which point, marked as node "A" in FIG. 1, the ESD stress can reach the gate oxide of the Mp3 and Mn3 devices in the interface circuits. Because some of the input pads of Circuit II are grounded, under this pin-to-pin ESD stress, an overstress voltage may be imposed across the gate oxides of the Mp3 and Mn3 devices. Such an overstress voltage across the gate oxides of the Mp3 and Mn3 devices in the interface circuits easily ruptures the gate oxide to cause unexpected ESD damage at the interface circuits while no damage occurs at the input ESD protection circuits. The ESD current discharging path is shown by the dashed lines in FIG. 1. Conversely, FIG. 2 illustrates the ESD current discharging path when the ESD voltage is attached to an input pin of Circuit II and an input pin of the Circuit I is relatively grounded. The ESD voltage is diverted into the VDD2 power line and then goes to the node "B" through the Mp4 device of the interface circuits between the Circuits I and II. The ESD overstress voltage is imposed across and damages the gate oxide of the Mp2 and Mn2 devices in the interface circuits. Thus, the interface circuits between separated power lines in a CMOS IC are endangered by such pin-to-pin ESD stress and the ESD protection circuits around the input pads and output pads can not protect against such unexpected ESD damage at the interface circuits of a CMOS with separated power pins and power lines.

Figure 3:
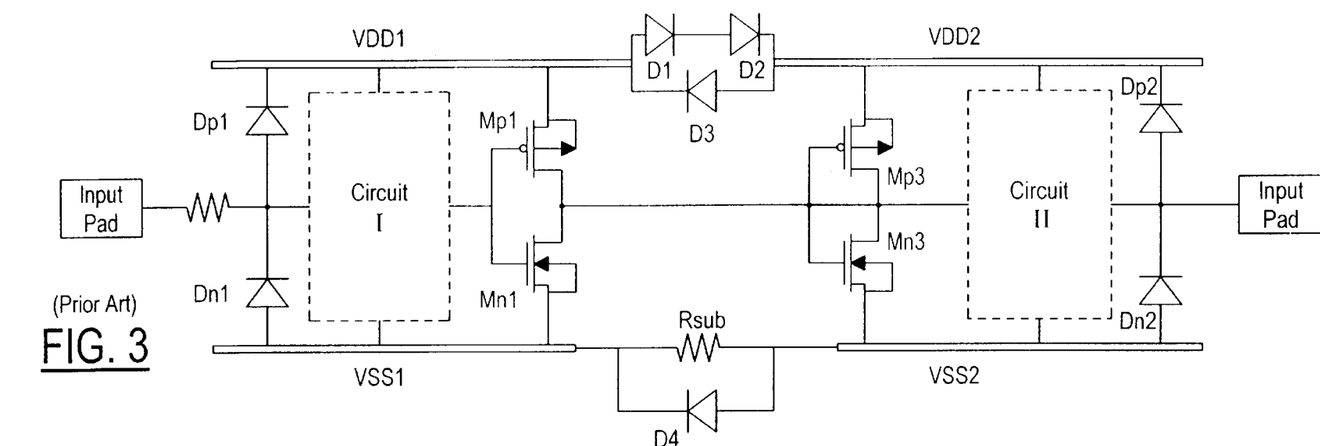
FIG. 3 is a schematic circuit diagram as in FIG. 1 showing the prior art of using series diodes to connect the separated power lines for ESD stress protection of the interface circuits.
Figure 4:
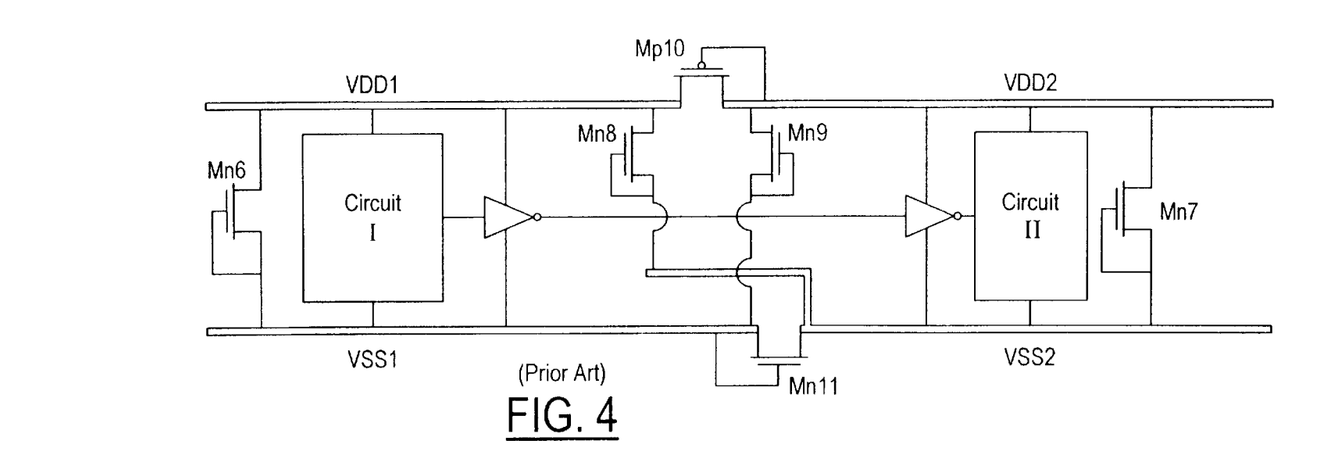
FIG. 4 is a schematic circuit diagram illustrating another prior art CMOS IC, with separated power pins, wherein four MOS devices are used to connect the separated power lines in such manner that the ESD stress across the interface circuits can be clamped by the four MOSs.

If the power lines in a CMOS IC are not separated, the unexpected ESD damage occurring at the interface circuits of the CMOS does not happen. To achieve a compromise between the requirement of separated power lines and ESD reliability, some prior art ICs have been designed using series diodes to connect the separated power lines. One typical design of such prior art is shown in FIG. 3 (see M.-D. Ker et al, 3) above), and another design to overcome such ESD problems is shown in FIG. 4 (see M.-D. Ker et al, 2) above), where four MOS devices (Mn8, Mn9, Mp10, and Mn11) are used to connect the separated power lines of the CMOS IC in such manner that the ESD stress across the interface circuits can be clamped by the four MOSs. Various shemes using diodes, MOSs, biased junction transistors (BJTs), or field oxide devices (FODs) to connect the separated power lines in a CMOS IC have recently been disclosed in U.S. Pat. Nos. 5,196,981; 5,290,724; 5,301,084; 5,426,323; 5,530,612; 5,610,791; 5,616,943; 5,625,280; and in the *Proc. of EOS/ESD Symp.*, 1993, pp. 239–249; and 1995, pp. 1–20.

Problem to be Solved

It will be seen therefore from the prior art that to protect CMOS ICs against ESD stresses, ESD protection circuits are generally added to the input and output pins and to overcome ESD damage caused by VDD-to-VSS ESD stress, an ESD clamp device has been added between the VDD and VSS power supply lines of IC chips. But, to effectively protect a CMOS IC with multiple separated power lines, some suitable ESD clamp devices have to be placed between the separated power lines of the CMOS IC to avoid ESD damage occurring at the interface circuits between the circuits supplied by the different power lines.

Object

It is accordingly an object of the present invention to provide suitable novel ESD clamp devices to protect CMOS ICs with separated multiple power lines or power pins from ESD damage to the interface circuits between the circuits supplied by the different power lines.

It is a particular object of the present invention to provide ESD clamp devices with bi-directional SCRs to protect CMOS ICs with separated multiple power lines or power pins from ESD damage.

SUMMARY OF THE INVENTION

The present invention involves a method and means for protecting CMOS ICs with separated multiple power lines or pins by using bi-directional SCRs with a clamp arrangement coupling the separated lines that acts to prevent ESD damage to the interface circuits between the circuits supplied by the different power lines. CMOS VLSI chips with pin counts greater than 100 often have multiple power pins to supply sufficient current for circuit operations. In mixed voltage ICs there are separated power pins with different power supplies for specified power operations, and in these ICs the power supplies for the digital and analog circuits are often separated due to noise considerations. In such ICs with separated power pins, the interface circuits between the circuits with different power pins are vulnerable to ESD stress. Even though there are suitable ESD protection circuits around the input and output pins of the IC, unexpected ESD damage still happens to the interface circuits between the circuits with different power pins, so that a whole-chip ESD protection arrangement is needed.

Due to the low holding voltage of the SCR device, the power dissipation occurring in an SCR device during ESD stress is less than that occurring on other ESD protection devices, such as diodes, MOSs, BJTs, or FODs, used in CMOS technologies. Hence, an SCR device can sustain a much higher ESD stress level within smaller layout areas in CMOS ICs. As a result of this capability, SCR devices have been used as the main ESD-clamped devices in several input ESD protection circuits of CMOS ICs. However, the present invention utilizes bi-directional SCRs to prevent ESD damage to the interface circuits between the circuits supplied by the different power lines. The bi-directional SCRs are placed between the separated power lines of the CMOS IC to provide ESD current discharging paths between the separated power lines. Thus, the vulnerable internal circuits and interface circuits between the different power pins are rendered remote from the ESD damage. This ESD protection arrangement can be applied to chips having multiple or mixed-voltage power pins.

BRIEF DESCRIPTION OF THE DRAWINGS

The objects, features and advantages of the present invention will become apparent from the following detailed description and the appended drawings in which:

FIG. 17 is a schematic circuit diagram illustrating a circuit in accordance with the invention, wherein, as compared to the circuit arrangement in FIG. 7, the ESD-connection devices between the separated VSS1 and VSS2 power lines contain P-type SCR devices, PSCR3 and PSCR4, in the bi-directional configuration that have the same function as that of the diodes in FIG. 3, but are used to connect the separated power lines so that in the ESD-stress condition without the power supplies, the devices can provide short circuit paths between the power lines to bypass ESD stress across the interface circuits, and under normal operating conditions with the VDD1–VSS1 and VDD2–VSS2 power supplies, the gates of the inserted PMOS in the PSCR3, PSCR4 devices are connected to the separated VSS1, VSS2 lines which are at the same voltage level i.e., grounded, so that PSCR3 and PSCR4 are kept OFF when the IC is in the normal operating condition.

DETAILED DESCRIPTION OF THE INVENTION

Figure 5A:
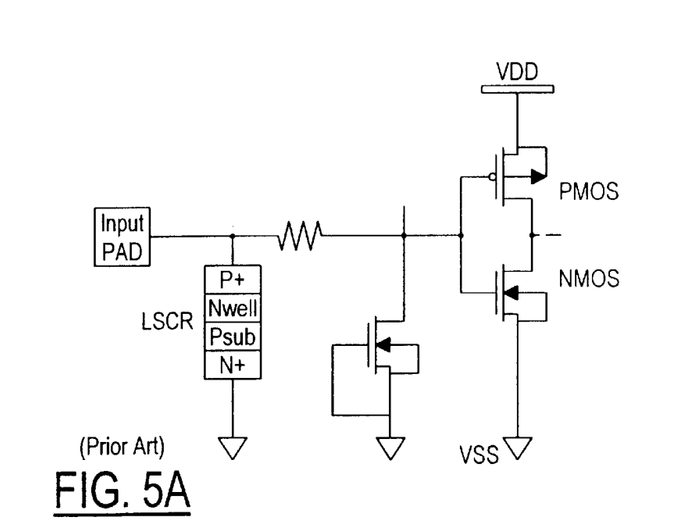
FIG. 5(a) illustrates a typical prior art input ESD protection circuit for a CMOS IC input stage using a lateral SCR (LSCR) as an ESD protection device.
Figure 5B:
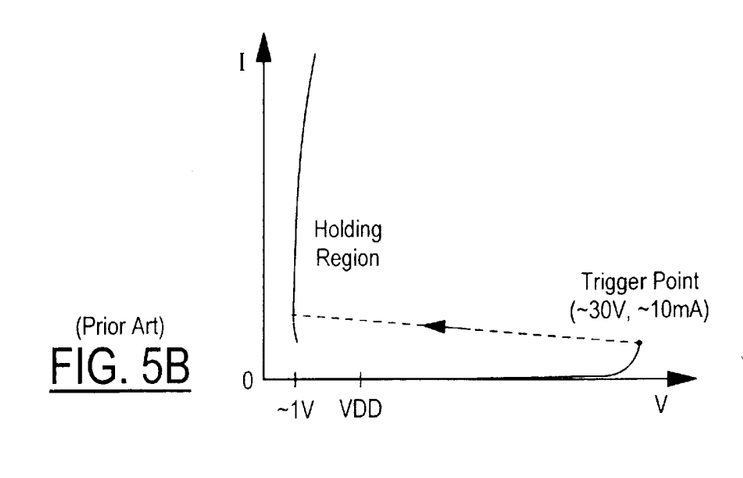
FIG. 5(b) is a plot illustrating the I-V characteristics of the LSCR device in submicron CMOS technology illustrated in FIG. 5(a).
Figure 6A:
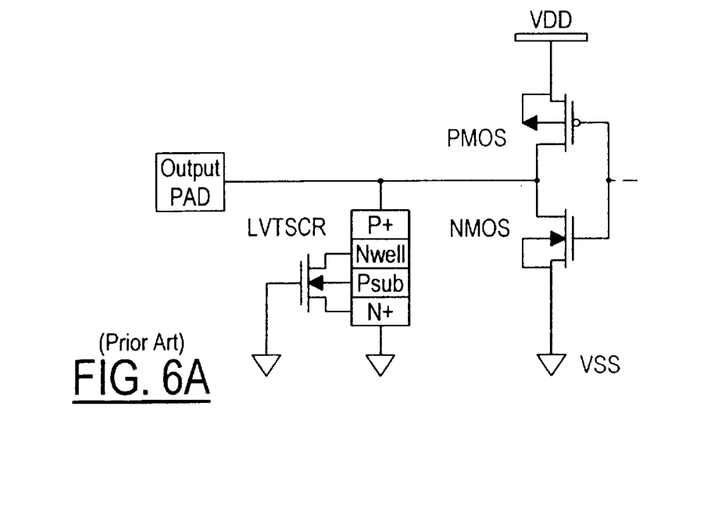
FIG. 6(a) illustrates a typical prior art output ESD protection circuit for a CMOS IC output buffer using a low-voltage triggering SCR (LVTSCR) as an ESD protection device.
Figure 6B:
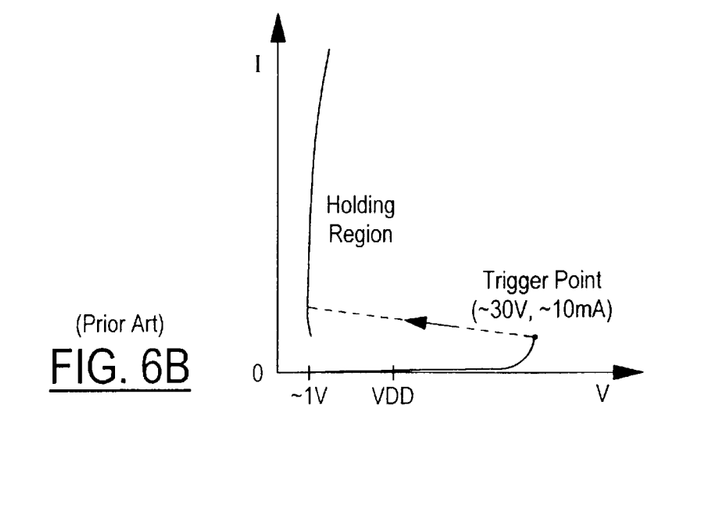
FIG. 6(b) is a plot illustrating the I-V characteristics of the LVTSCR device in submicron CMOS technology illustrated in FIG. 6(a).

The present invention involves the use of bi-directional SCRs in a clamp arrangement that acts to protect CMOS ICs with separated multiple power lines or power pins. Due to the low holding voltage (Vhold, ~1V in CMOS processes) of the SCR device, the power dissipation (Power≡$I_{ESD}$× $V_{HOLD}$) occurring in an SCR device during ESD stress is less than that occurring on other ESD protection devices, such as diodes, MOSs, BJTs, or FODs, used in CMOS technologies. Hence, the SCR device can sustain a much higher ESD stress level within smaller layout areas in CMOS ICs. As a result of this capability, SCR devices have been used as the main ESD-clamp devices in several input ESD protection circuits, see, for example U.S. Pat. Nos. 4,896,243; 4,939,616; 5,010,380; 5,012,317; 5,077,591; 5,140,401; 5,166,089; 5,182,220; 5,274,262; 5,289,334; 5,336,908; 5,343,053; 5,430,595; 5,400,202; and 5,473,169. However, SCR devices often have a higher trigger voltage (~30V) in submicron CMOS technology, which is generally greater than the gate-oxide breakdown voltage (~20V) of the input stages, so that SCR devices need a secondary protection circuit to perform the overall ESD protection function. The typical design for an input ESD protection circuit using a lateral SCR as an ESD protection device is shown in FIG. 5(a), and the I-V characteristics of this (LSCR) device in submicron CMOS technology is illustrated in FIG. 5(b). Due to the high trigger voltage, such an SCR device is only used to protect the input stage with the help of a secondary protection circuit. In order to effectively protect the output buffer using a single SCR device, the low-voltage-triggering SCR (LVTSCR) device was developed to lower the SCR trigger voltage (see, e.g., A. Chaterjee et al, "A low-voltage triggering SCR for on-chip ESD protection at output and input pads," *Proc. Symp. On VLSI Technology*, 1990, pp.75–76, and *IEEE Electron Device Letters*, vol.12, pp.21–22, January 1991). The typical design for an output ESD protection circuit with the LVTSCR device is shown in FIG. 6(a), and the I-V characteristics of this LVTSCR device in submicron CMOS technology is illustrated in FIG. 6(b). The use of the LVTSCR device for on-chip ESD protection has been well developed to achieve excellent ESD-protection efficiency (see, e.g., U.S. Pat. Nos. 5,400,202; 5,452,171; 5,465,189; 5,528,188; 5,572,394; 5,576,557; and 5,610,425).

Figure 7:
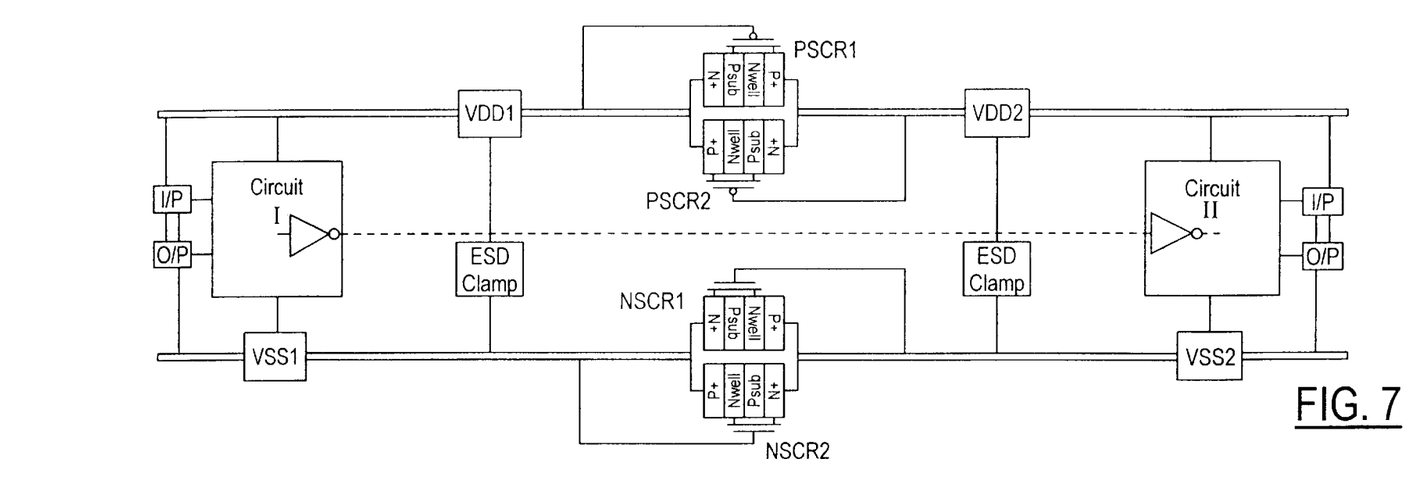
FIG. 7 is a schematic circuit diagram illustrating one embodiment of the present invention involving a whole-chip ESD protection scheme for a CMOS IC, with separated power pins, wherein bi-directional SCR devices are used to protect the interface circuits from ESD stress.
Figure 8:
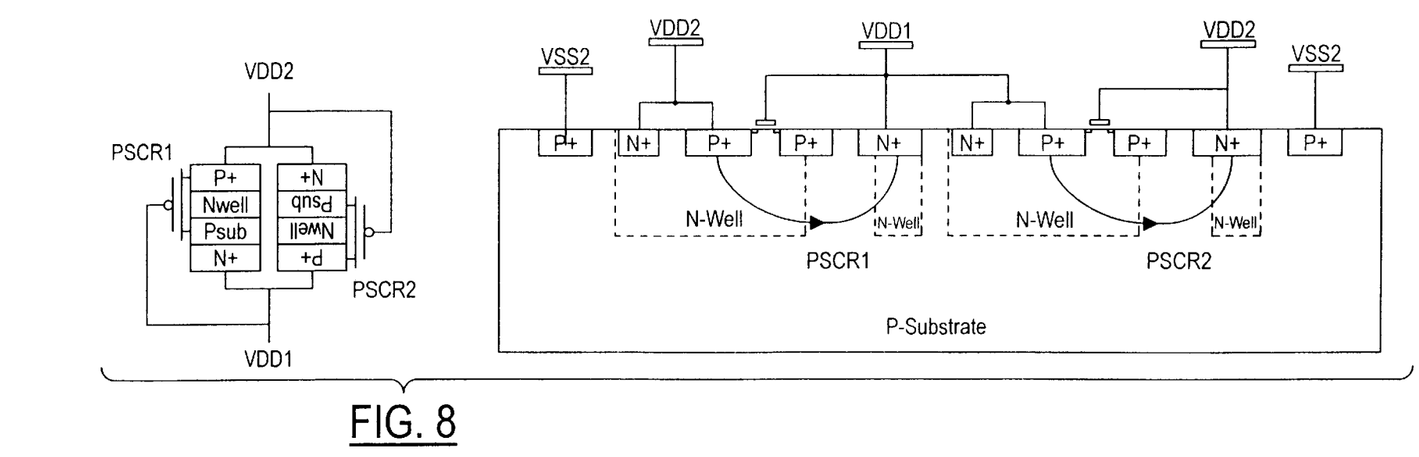
FIG. 8 shows the device structures of the P-type bi-directional SCR configuration in FIG. 7, wherein two bi-directional P-type SCR devices, PSCR1 and PSCR2, are added between the separated VDD1 and VDD2 power lines to bypass ESD stress and are controlled by the inserted PMOS devices in the SCR structures.
Figure 9:
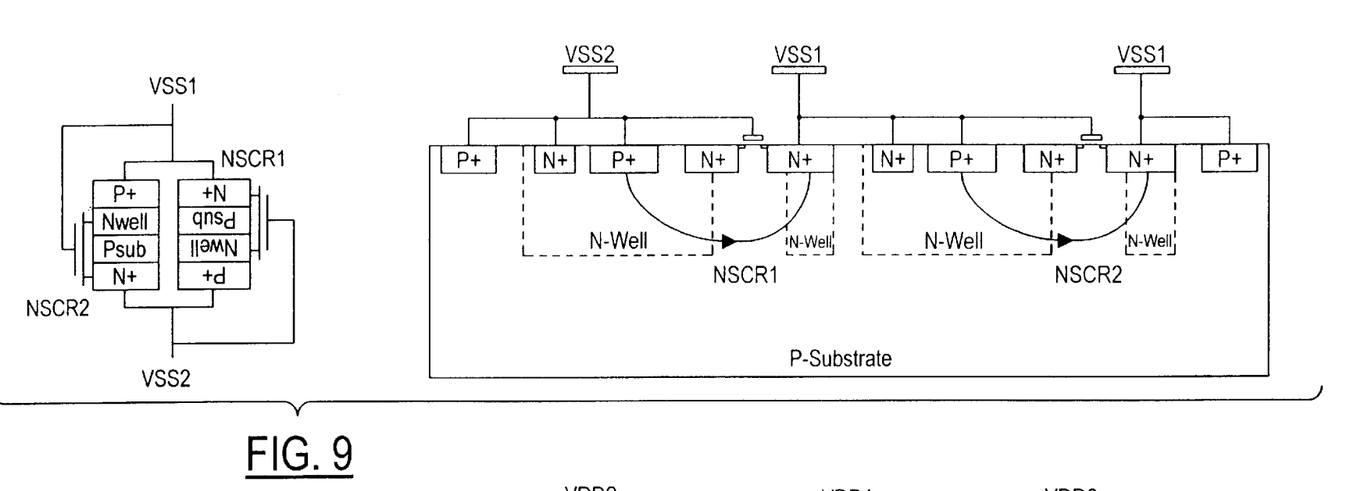
FIG. 9 shows the device structure of the N-type bi-directional SCR configuration in FIG. 7, wherein two bi-directional N-type SCR devices, NSCR1 and NSCR2, are added between the separated VSS1 and VSS2 power lines to bypass ESD stress and are controlled by the inserted NMOS devices in the SCR structures.
Figure 10:
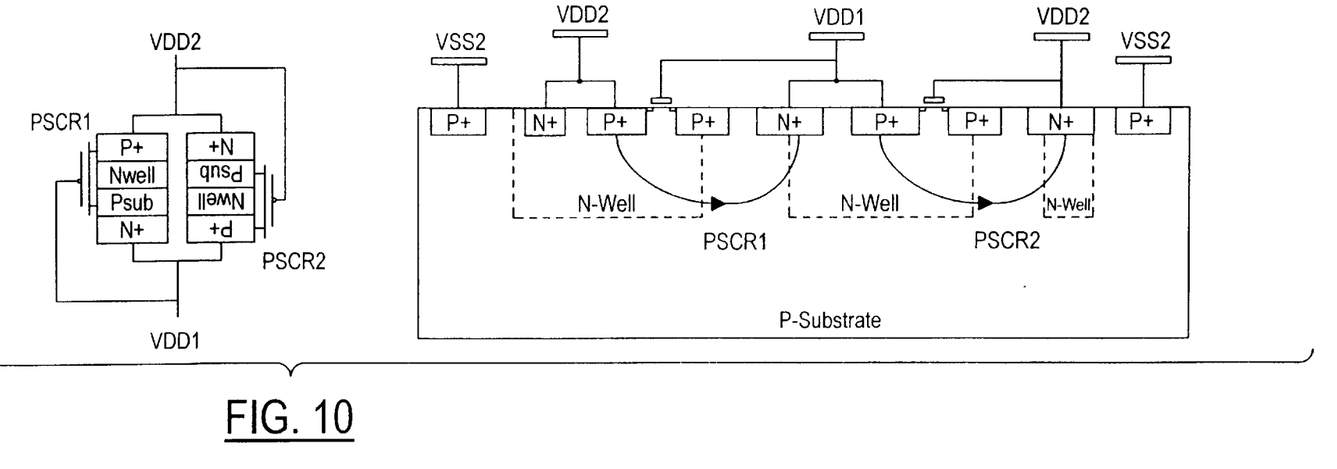
FIG. 10 illustrates an alternative device structure to that of FIG. 8 wherein to save more layout area for the bi-directional SCR devices, the device structures for both the PSCR1 and PSCR2 can be further merged as shown.
Figure 11:
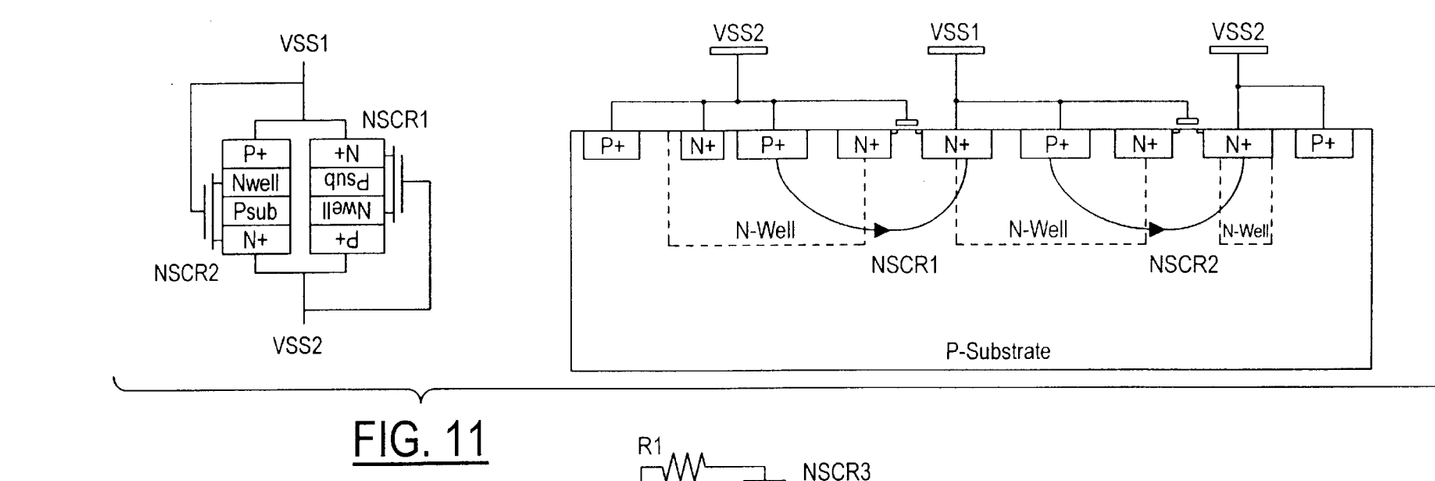
FIG. 11 illustrates an alternative device structure to that of FIG. 9 wherein to save more layout area for the bi-directional SCR devices, the device structures for both the NSCR1 and NSCR2 can be further merged as shown.

In the foregoing designs using SCR, LSCR, or LVTSCR devices, the devices are only placed between the input or output pads and the VSS (or even VDD) power line to perform ESD protection for the input stages or output buffers around the input or output pads. In contrast, the present invention uses bi-directional SCR devices to protect the interface circuits of CMOS ICs with separated power pins, i.e., the bi-directional SCRs are not located around the input and output pads, but rather located between the separated power lines to achieve real whole-chip ESD protection. Accordingly, a whole-chip ESD protection scheme using bi-directional SCR devices to overcome ESD failure in the IC interface circuits in accordance with the invention is shown in FIG. 7. As seen in the Figure, two bi-directional P-type SCR devices, PSCR1 and PSCR2, are added between the separated VDD1 and VDD2 power lines to bypass ESD stress, and two bi-directional N-type SCR devices, NSCR1 and NSCR2, are added between the separated VSS1 and VSS2 power lines to bypass ESD stress. The device structures of the P-type SCR devices, PSCR1 and PSCR2, are shown in detail in FIG. 8, where the SCR devices are controlled by the inserted PMOS devices in the SCR structures. If the inserted PMOS is turned ON by its control-gate voltage, the P-type SCR device can be directly turned ON. Consequently, the trigger voltage of such P-type SCR devices is the same as the turn-on voltage of the PMOS device which is inserted into the SCR structure. In submicron CMOS technology, the trigger voltage of such P-type bi-directional SCR devices is about 1 V. Similarly, the device structures of the N-type SCR devices, NSCR1 and NSCR2, are shown in FIG. 9, where the SCR devices are controlled by the inserted NMOS devices in the SCR structures. Again, if the inserted NMOS is turned ON by its control-gate voltage, the N-type SCR device can be directly turned ON; and, the trigger voltage of such N-type SCR devices is the same as the turn-on voltage of the NMOS device which is inserted into the SCR structure. The trigger voltage of such N-type bi-directional SCR devices is also about 1 V. To save more layout area for such bi-directional SCR devices, the device structure of FIG. 8 for both the PSCR1 and PSCR2 devices can be further merged as shown in FIG. 10, and the device structure in FIG. 9 for both the NSCR1 and NSCR2 devices can be merged as shown in FIG. 11.

Figure 12:
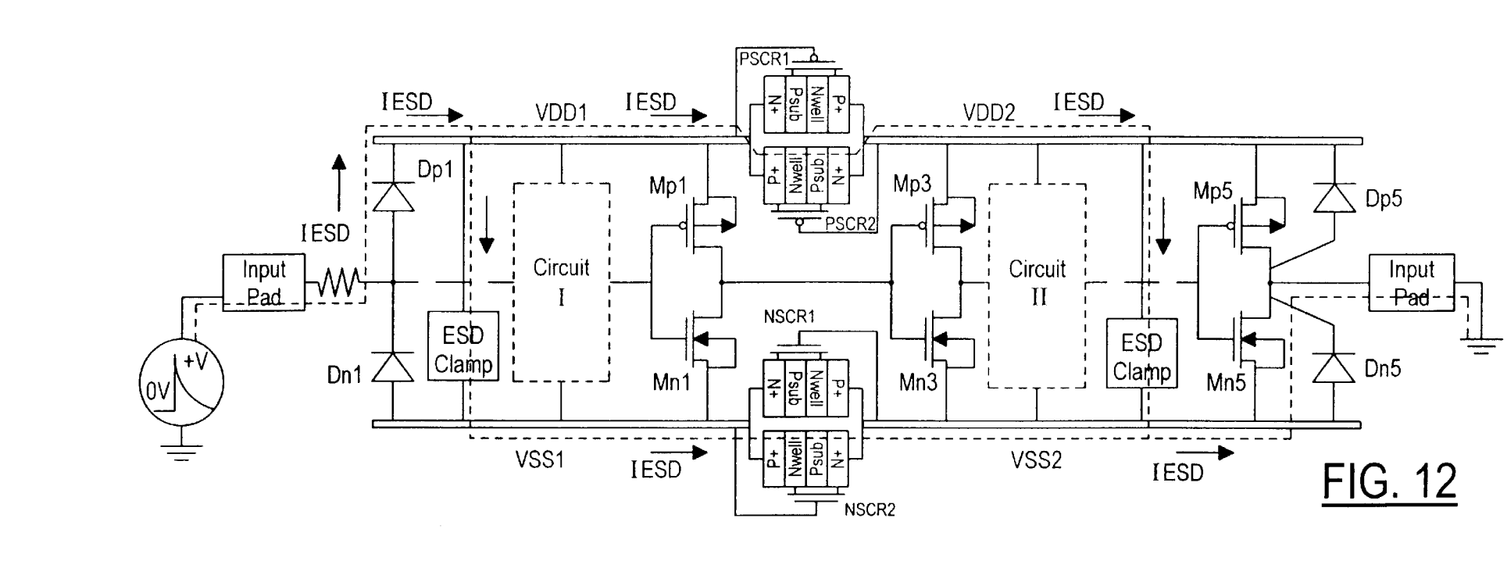
FIG. 12 is a schematic circuit diagram illustrating the protection function of the bi-directional SCR devices of the invention between separated power lines, wherein the ESD voltage for the pin-to-pin ESD stress is shown to attach to an input pin of Circuit I with an output pin of Circuit II relatively grounded, and all of the other pins, including the power pins, floating, and showing the ESD current discharging paths by the dashed lines.
Figure 13:
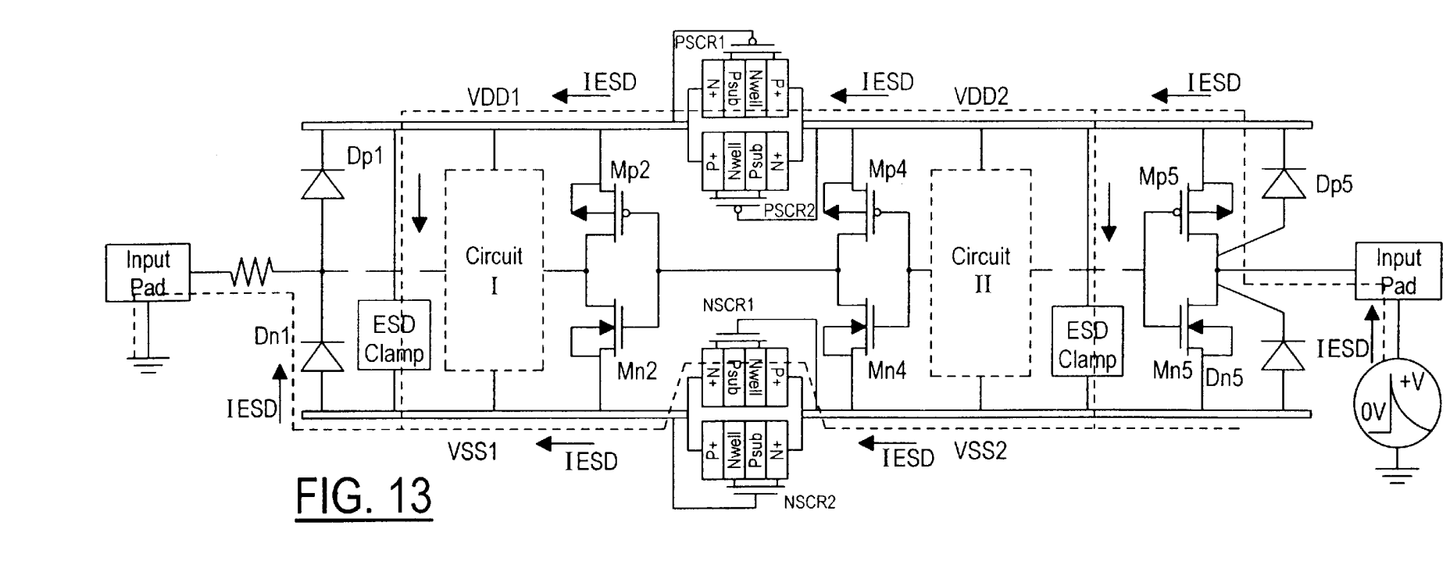
FIG. 13 is another schematic circuit diagram illustrating the protection function of the bi-directional SCR devices of the invention between separated power lines, wherein the ESD voltage for the pin-to-pin ESD stress is shown to attach to an output pin of Circuit II while an input pin of Circuit I is relatively grounded, and all of the other pins, including the power pins, are floating, and showing the ESD current discharging paths by the dashed lines.

The protection function of the bi-directional SCR devices coupled between separated power lines in accordance with the invention is illustrated in FIGS. 12 and 13 under the pin-to-pin ESD-stress conditions. As seen in FIG. 12, the ESD voltage for the pin-to-pin ESD stress attaches to an input pin of Circuit I with an output pin of Circuit II relatively grounded, and all of the other pins, including the power pins, floating. The ESD current discharging paths are indicated by the dashed lines in FIG. 12 to show the whole-chip ESD protection design using the bi-directional SCR devices between the separated power lines. The ESD voltage is first diverted into the VDD1 power line through the diode Dp1 in the ESD protection circuit of Circuit I, and then a resulting ESD current, $I_{ESD}$, goes through the PSCR2 device into the VDD2 power line without causing ESD damage to the interface circuits, Mp1, Mn1, and Mp3, Mn3. As the PSCR2 device has a gate connected to the VDD2 power line, when the voltage on the VDD1 power line increases to greater than the voltage on the VDD2 power line by more than 1 V, the PSCR2 device will be turned ON to provide a low-impedance path for the resulting current from the VDD1 line to the VDD2 line. Thus, the ESD voltage on the VDD1 power line can be diverted into the VDD2 power line through the PSCR2 device to keep the ESD stress away from the interface circuits. The ESD voltage on the VDD2 power line is discharged to the VSS2 power line, by current $I_{ESD}$ through the ESD clamp device connected between the VDD2 and VSS2 power supply lines. Also, the ESD voltage on the VDD1 power line is discharged through the ESD clamp device that is connected between the VDD1 and VSS1 power supply lines, to the VSS1 power line, and the current $I_{ESD}$ then goes into the VSS2 power line through the NSCR2 device. The NSCR2 device has a gate connected to the VSS1 power line, and if the voltage on the VSS1 power line is greater than the voltage on the VSS2 power line by more than 1 V, the NSCR2 device is turned ON to provide a low-impedance path from the VSS1 line to the VSS2 line. Finally, the ESD current, $I_{ESD}$, is discharged through the diode Dn5 of the output NMOS Mn5 to the grounded output pad.

An alternative pin-to-pin ESD stress arrangment is shown in FIG. 13, wherein the ESD voltage attaches to an output pin of Circuit II while an input pin of Circuit I is relatively grounded, and all of the other pins, including the power pins, are floating. As seen in the Figure, the ESD voltage is first diverted into the VDD2 power line through the diode Dp5 in the output PMOS Mp5 of Circuit II, and then the ESD current, $I_{ESD}$, goes through the PSCR1 device into the VDD1 power line without causing ESD damage to the interface circuits, Mp4, Mn4, and Mp2, Mn2. Here, the PSCR1 device has a gate connected to the VDD1 power line, so that when the voltage on the VDD2 power line is greater than the voltage on the VDD1 power line by more than 1 V, the PSCR1 device is turned ON to provide a low-impedance current path from the VDD2 line to the VDD1 line. Thus, the ESD voltage on the VDD2 power line can be diverted into the VDD1 power line through the PSCR1 device to keep the ESD stress away from the interface circuits. The ESD voltage on the VDD1 power line is discharged through the ESD clamp device, connected between the VDD1 and VSS1 lines, to the VSS1 power line. Similarly, The ESD voltage on the VDD2 power line is discharged through the ESD clamp device, connected between the VDD2 and VSS2 lines, to the VSS2 power line, and then goes into the VSS1 power line through the NSCR1 device. Here, the NSCR1 device has a gate connected to the VSS2 power line, and when the voltage on the VSS2 power line becomes greater than the voltage on the VSS1 power line by more than 1 V, the NSCR1 device is turned ON to provide a low-impedance current path from the VSS2 line to the VSS1 line. Finally, the ESD current is discharged through the diode Dn1 of the input protection circuit to the grounded input pad. The ESD current discharging paths are indicated by the dashed lines in FIG. 13 to show the whole-chip ESD protection design by using the bi-directional SCR devices between the separated power lines.

In the foregoing FIG. 12 and FIG. 13 circuit arrangements when the IC is in the normal operating condition, the power supplies VDD1 and VDD2 have the same voltage level, e.g., 5 V, for supplying current to the operating circuits. Because the gate-to-source voltage of the inserted PMOSs in the PSCR1 and PSCR2 devices are both kept at 0 V, the PMOSs are in the OFF state. Hence, the bi-directional PSCR1 and PSCR2 devices are both kept OFF, when the IC is in normal opersating condition, to block coupling of the separated power lines in the IC. On the other hand, the VSS1 and VSS2 lines also have the same voltage level, e.g., 0 V, so that the gate-to-source voltage of the inserted NMOSs in the NSCR1 and NSCR2 devices are both kept at 0 V, and the NMOSs are in the OFF state. Thus, the bi-directional NSCR1 and NSCR2 are both kept OFF, when the IC is in normal operating condition, to block coupling of the separated power lines in the IC.

In summary, all the bi-directional SCR devices between the separated power lines are kept OFF to block communication between the power lines when the IC is in normal operating condition. Therefore, the initial purpose of separating the power lines of the CMOS IC can be achieved. But, under ESD-stress conditions, the bi-directional SCR devices between the separated power lines can be turned ON to bypass ESD current between the separated power lines and protect the interface circuits at the separated power lines. Accordingly, the present invention with bi-directional SCR devices can provide the CMOS IC with effective whole-chip ESD protection during ESD-stress conditions, and still keeps the the power lines separated when the IC is in normal operating condition.

Figure 14:
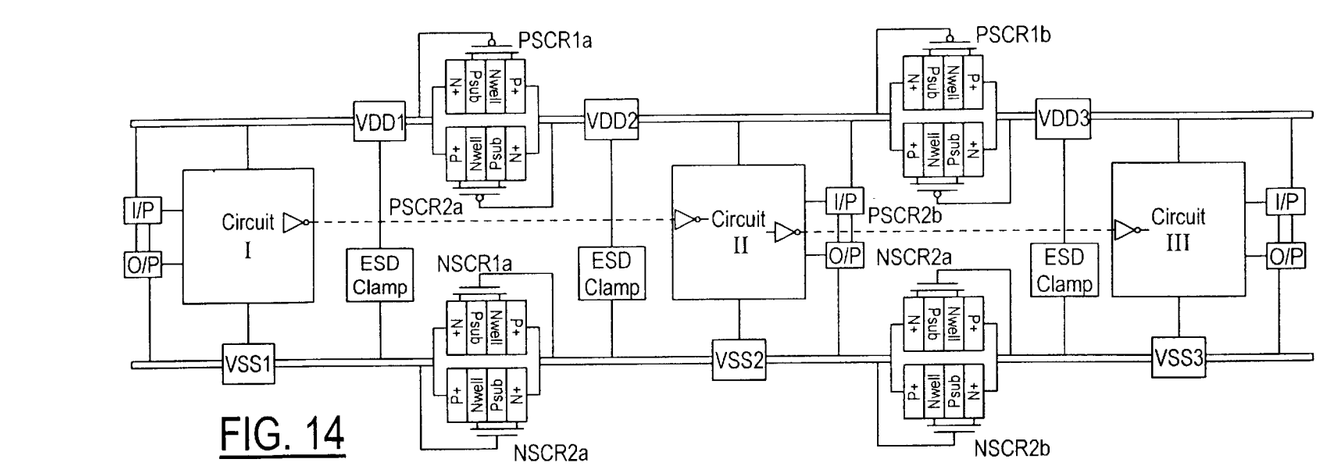
FIG. 14 is a schematic circuit diagram illustrating the bi-directional SCR devices of the invention implemented in an IC with multiple power pins in three circuit parts, Circuit I, Circuit II, and Circuit III, each part having its own power pins, wherein power sources VDD1–VSS1 supply power to Circuit I, sources VDD2–VSS2 supply power to Circuit II, and sources VDD3–VSS3 supply power to Circuit III, and the interface circuits between the three circuit parts are vulnerable to pin-to-pin ESD stresses, so that bi-directional SCR devices are added as shown between the separated power lines in accordance with the invention to protect against ESD stress across the interface circuits.

The bi-directional SCR devices of the invention can also be implemented in an IC with multiple power pins in a manner such as shown in FIG. 14. As seen in the Figure, the IC has three circuit parts, Circuit I, Circuit II, and Circuit III, and each part has its own power pins. Power sources VDD1–VSS1 supply power to Circuit I, sources VDD2–VSS2 supply power to Circuit II, and sources VDD3–VSS3 supply power to Circuit III. The interface circuits between the three circuit parts are vulnerable to pin-to-pin ESD stresses, so that bi-directional SCR devices, PSCR1a, PSCR1b, PSCR2a, PSCR2b, and NSCR1a, NSCR1b, NSCR2a, NSCR2b, are added between the separated power lines in accordance with the invention to protect against ESD stress across the interface circuits. To reduce the noise coupling effect between the separated VDD power lines or the separated VSS power lines, the number of bi-directional SCR devices in each branch can be increased to increase the noise margin.

Figure 15:
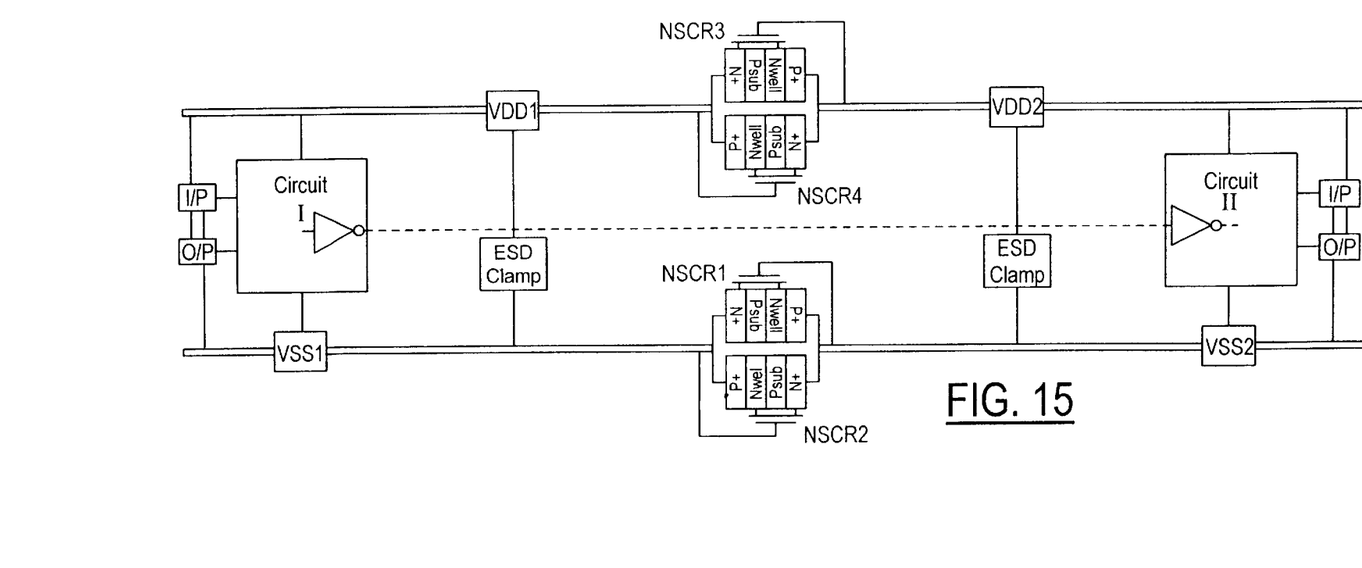
FIG. 15 is a schematic circuit diagram illustrating bi-directional SCR devices of the invention in an alternative implementation providing ESD-current discharging paths between separated power lines wherein the ESD-connection devices between the VDD1 and VDD2 lines, in contrast to the arrangement in FIG. 3, are N-type SCR devices which function in the bi-directional configuration in the same general manner as those in FIG. 3 but with different device structures using NSCR3 and NSCR4 to connect the separated VDD1 and VDD2 power lines, so that in the ESD-stress condition without the power supplies, the NSCR3 and NSCR4 devices can provide short circuit paths between the separated power lines to bypass ESD stress across the interface circuits.

Other alternative implementations of the invention in providing ESD-current discharging paths between separated power lines are shown in FIGS. 15–22. For example, in FIG. 15, the ESD-connection devices between the separated VDD1 and VDD2 power lines, in contrast to the foregoing prior art arrangement in FIG. 3, are N-type SCR devices which have the same function as that of the diodes in FIG. 3 but with different device structures. In FIG. 15, devices NSCR3 and NSCR4 are used to connect the separated VDD1 and VDD2 power lines. In the ESD-stress condition without the power supplies, the NSCR3 and NSCR4 devices can provide short circuit paths between the separated power lines to bypass ESD stress across the interface circuits. Under normal operating conditions with the VDD1 and VDD2 power supplies, the gate of the inserted NMOS in the NSCR3 (NSCR4) device is connected to the VDD2 (VDD1) line which has a voltage level greater than the NMOS threshold voltage. Thus, the inserted NMOSs in the NSCR3 and NSCR4 devices are turned ON in this condition to share the current between the VDD1 and VDD2 lines. But, devices NSCR3 and NSCR4 are not turned ON because the holding voltage of such N-type SCR devices is about 1 V. The voltage level between the VDD1 and VDD2 power lines is the same when the IC is in normal operating condition, so the voltage difference between them is 0, which is much smaller than the holding voltage of the NSCR3 and NSCR4 devices. Therefore, the NSCR3 and NSCR4 devices are guaranteed to be OFF, but the inserted NMOSs are ON, sharing the current between the VDD1 and VDD2 lines for normal circuit operations in the IC. This is a different application using the bi-directional N-type SCR devices for whole-chip ESD protection.

Figure 16:
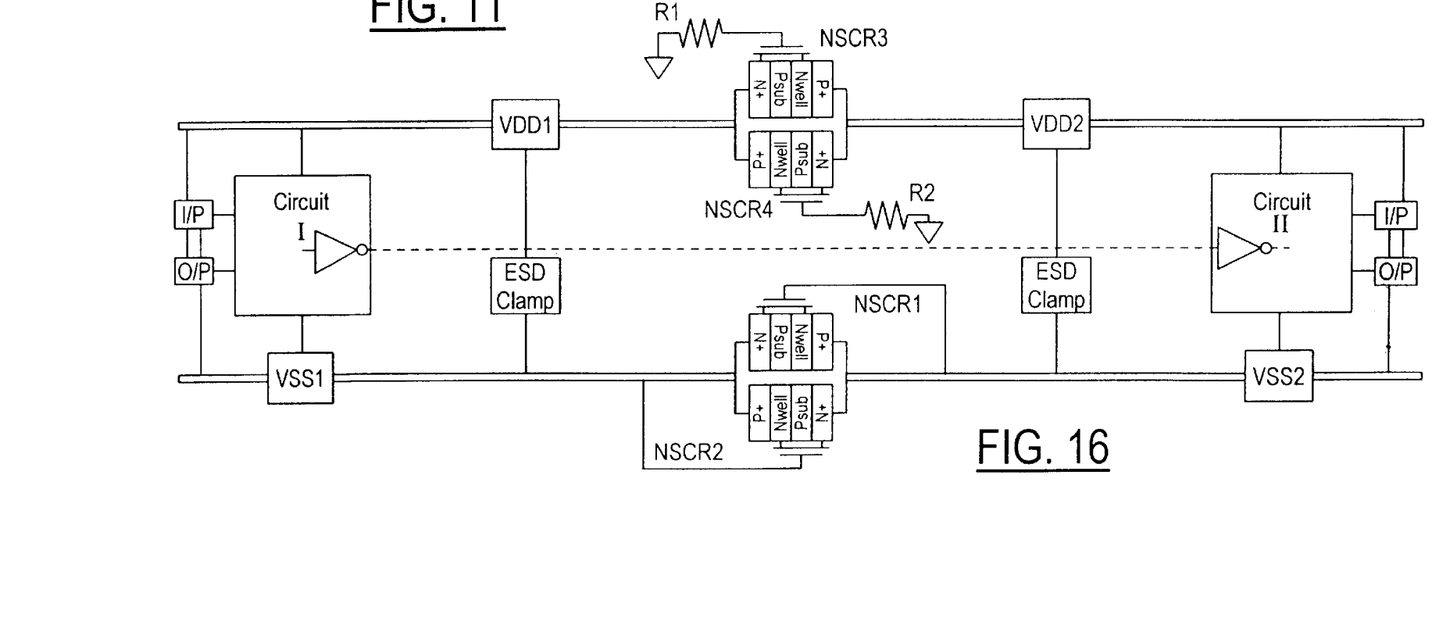
FIG. 16 illustrates a modifed version of the FIG. 15 circuit arrangement for use if a circuit application is not to share the current between the VDD1 and VDD2 lines when the IC is in the normal operating condition, and wherein the gate of the inserted NMOS in the NSCR3 (NSCR4) device is connected to ground through a resistor R1 (R2) so that the device is kept OFF to block the current path between the VDD1 and VDD2 lines in normal operating condition, but under ESD-stress conditions, the NSCR3 and NSCR4 devices are triggered ON by the drain snapback breakdown to provide short circuit paths between the VDD1 and VDD2 lines to conduct the ESD current between the separated power lines.

If a circuit application is not to share the current between the VDD1 and VDD2 lines when the IC is in the normal operating condition, a modifed version of the FIG. 15 arrangement is shown in FIG. 16, wherein the gate of the inserted NMOS in the NSCR3 (NSCR4) device is connected to ground through the resistor R1 (R2). Because the gate of the inserted NMOS in the NSCR3 (NSCR4) device is connected to ground, the inserted NMOS in the NSCR3 (NSCR4) device is kept OFF to block the current path between the separated VDD1 and VDD2 power lines. The NSCR3 and NSCR4 devices are also kept OFF when the IC is in normal operating condition. Under ESD-stress conditions, the NSCR3 and NSCR4 devices are triggered ON by the drain snapback breakdown (see, e.g., A. Chaterjee et al, "A low-voltage triggering SCR for on-chip ESD protection at output and input pads," Proc. Symp. On VLSI Technology, 1990, pp.75–76, and IEEE Electron Device Letters, vol. 12, pp.21–22, January 1991) to provide short circuit paths between the VDD1 and VDD2 lines. Therefore, in the FIG. 16 configuration, the NSCR3 and NSCR4 devices are guaranteed to be OFF, and the inserted NMOSs are also kept OFF for normal operating conditions in the CMOS ICs. But, in ESD-stress conditions, the NSCR1, NSCR2, NSCR3, and NSCR4 devices in FIG. 16 can be triggered ON to conduct the ESD current between the separated power lines.

Figure 17:
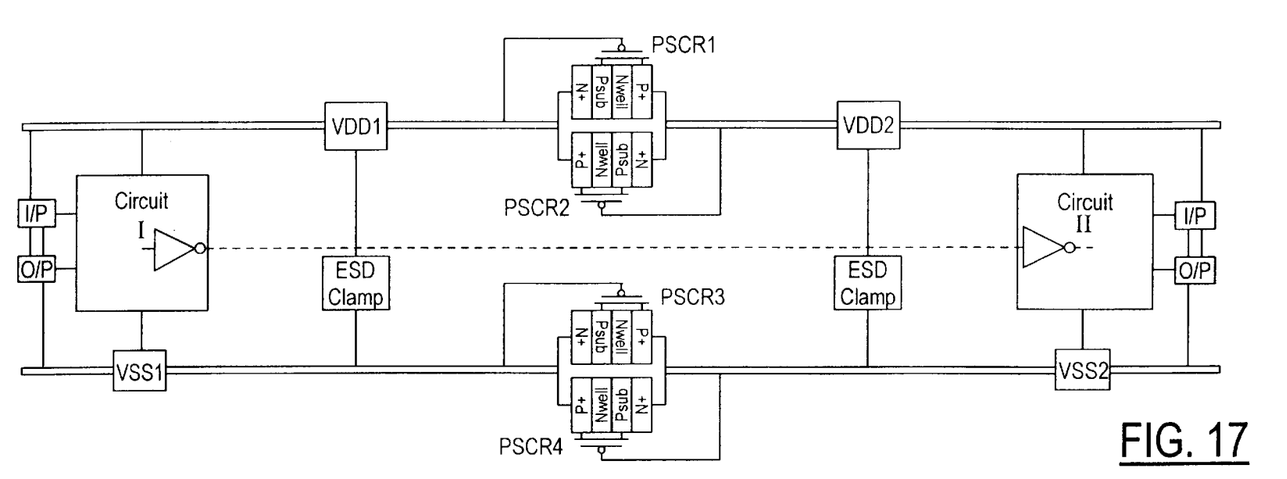

As compared to the circuit arrangement in FIG. 7, the ESD-connection devices in FIG. 17 between the VSS1 and VSS2 lines contain P-type SCR devices in the bi-directional configuration which have the same function as that of the diodes in FIG. 3 but with different device structures. In FIG. 17, the PSCR3 and PSCR4 devices are used to connect the separated VSS1 and VSS2 power lines. In the ESD-stress condition without the power supplies, the PSCR3 and PSCR4 devices can provide short circuit paths between the separated power lines to bypass ESD stress across the interface circuits. Under normal operating conditions with the VDD1–VSS1 and VDD2–VSS2 power supplies, the gate of the inserted PMOS in the PSCR3 (PSCR4) device is connected to the VSS1 (VSS2) line. Because all of the nodes of the PSCR3 and PSCR4 devices are connected to the same voltage level of the VSS1 and VSS2 lines, which are normally grounded, the PSCR3 and PSCR4 devices are therefore kept OFF when the IC is in the normal operating condition. But in the ESD-stress conditions, if the voltage level on the VSS2 power line is greater than the voltage level of VSS1 by more than about 1 V, the PSCR3 device is turned ON to provide a short-circuit path between the VSS2 and VSS1 lines. If the voltage level on the VSS1 power line is greater than the voltage level of VSS2 by more than about 1 V, the PSCR4 device is turned ON to provide a short-circuit path between the VSS2 and VSS1 lines. So, the bi-directional PSCR3 and PSCR4 devices can provide conducting paths between the separated VSS1 and VSS2 power lines during ESD stress conditions to protect the interface circuits of the CMOS IC.

Figure 18:
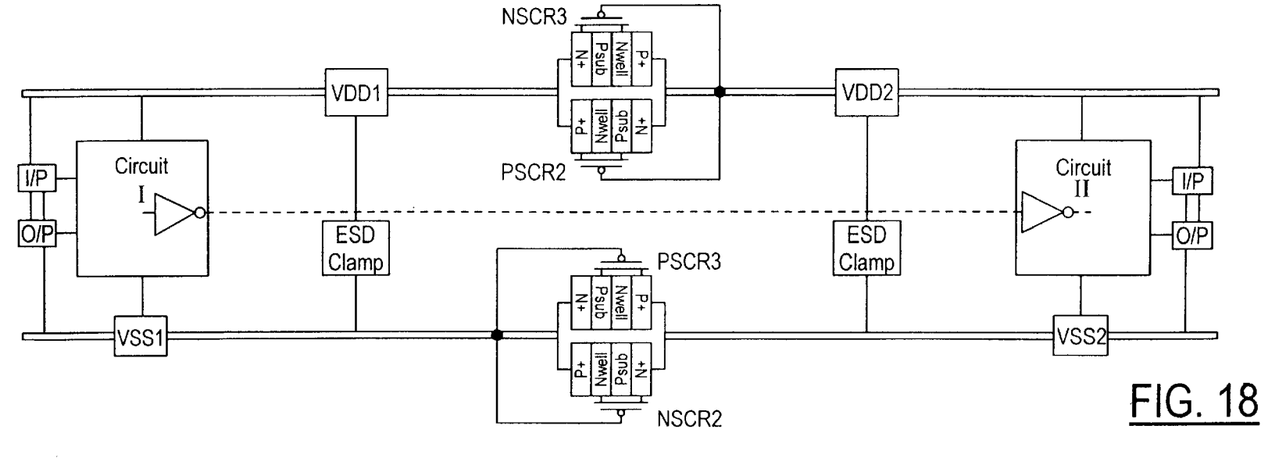
FIG. 18 is a schematic circuit diagram illustrating a circuit in accordance with the invention, wherein, as compared to the circuit arrangement in FIG. 7, one bi-directional SCR device has NCSR3 and PSCR2 devices that are used to connect the separated VDD1 and VDD2 power lines, and the other bi-directional SCR device has PSCR3 and NSCR2 devices are used to connect the separated VSS1 and VSS2 power lines.
Figure 19:
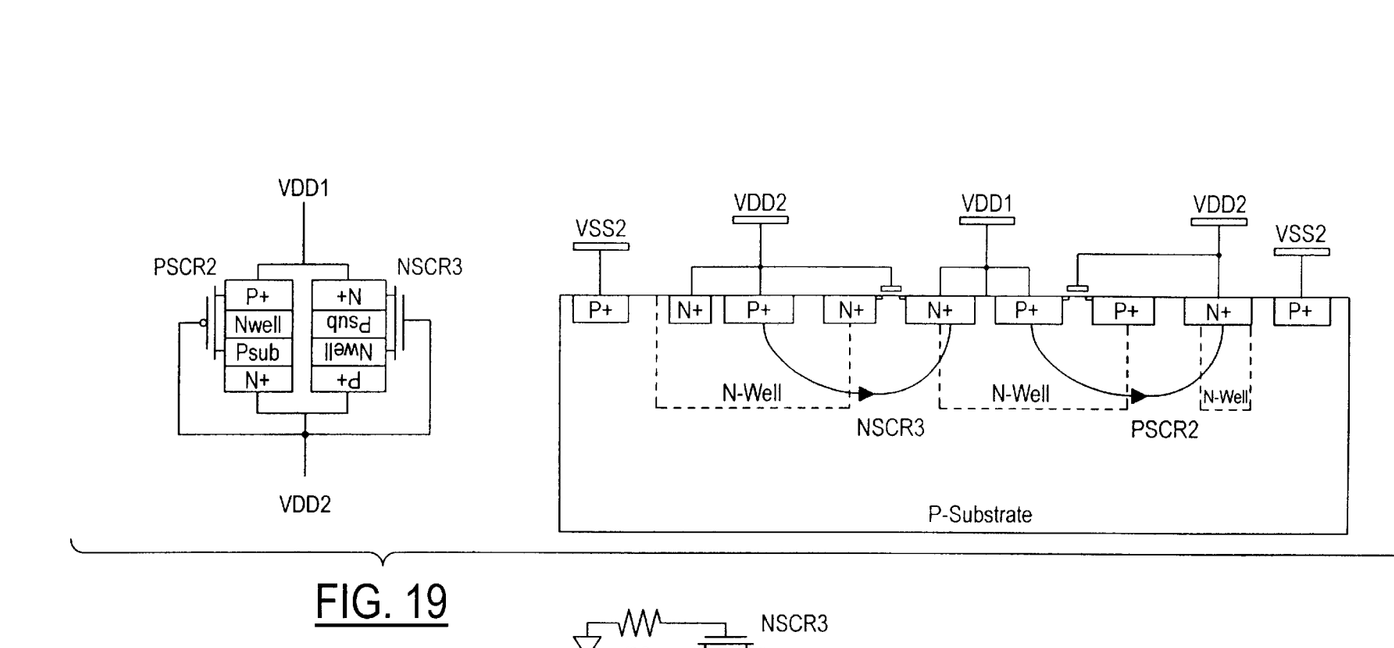
FIG. 19 shows the merged device structure of the upper bi-directional SCR device with NCSR3 and PSCR2 devices shown in FIG. 18.
Figure 20:
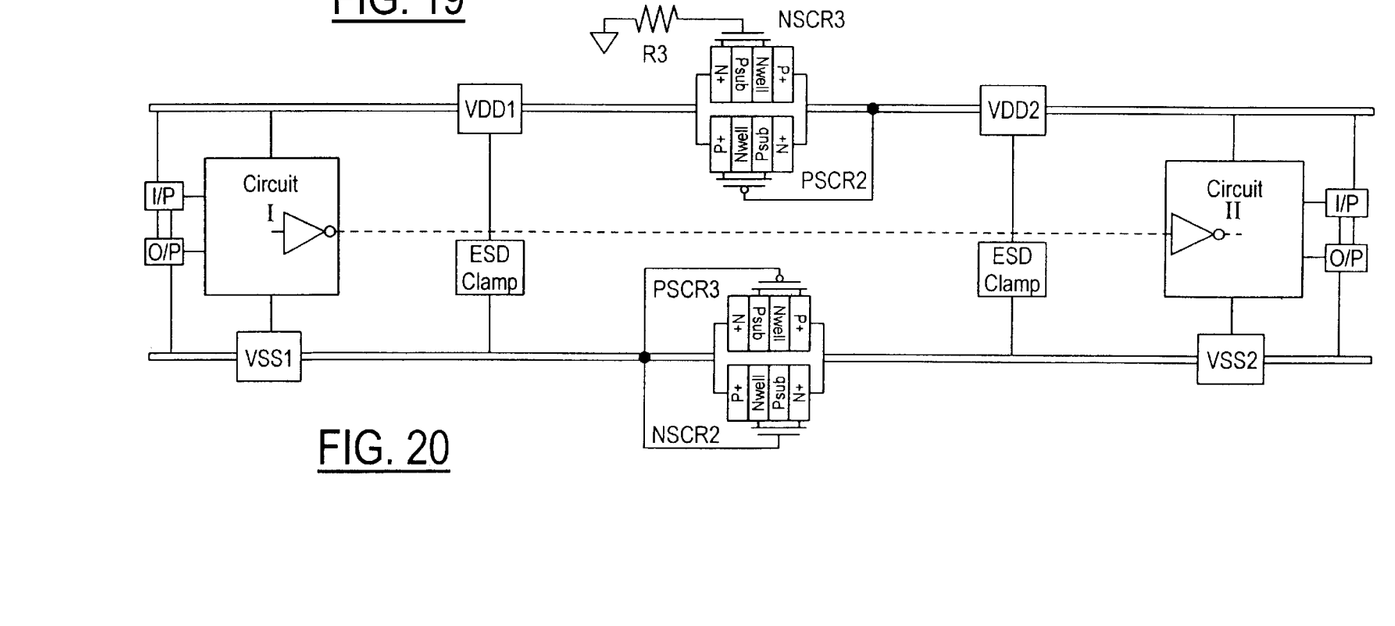
FIG. 20 is a schematic circuit diagram illustrating a circuit as in FIG. 18 but with the gate of the inserted NMOS in the NSCR3 device connected to ground through a resistor R3, to disable the current-sharing function of the inserted NMOS in the NSCR3 device between the VDD1 and VDD2, wherein both the inserted NMOS in the NSCR3 device and the inserted PMOS in the PSCR2 device are kept OFF when the IC is in the normal operating condition with the same voltage level in the separated VDD1 and VDD2 power lines.

In FIG. 18, the bi-directional SCR device with NCSR3 and PSCR2 devices is used to connect the separated VDD1 and VDD2 power lines, and the other bi-directional SCR device with PSCR3 and NSCR2 devices is used to connect the separated VSS1 and VSS2 power lines. The merged device structure of the former bi-directional SCR device with NCSR3 and PSCR2 devices is shown in FIG. 19. The gate of the inserted NMOS in the NSCR3 device in FIG. 18 is connected to VDD2. Under normal operating conditions with the power supplies, the inserted NMOS in the NSCR3 device is turned ON to share the current between the VDD1 and VDD2 lines. But, due to the fact that VDD1 and VDD2 are at the same voltage level, the NSCR3 and PSCR2 devices are kept OFF. The PSCR3 and NSCR2 devices are also kept OFF when the IC is in normal operating condition with power supplies VSS1 and VSS2 equal. In the ESD-stress condition without the power supplies, the NSCR3 and PSCR2 (PSCR3 and NSCR2) devices can provide ESD-current conducting paths between the separated power lines VDD1 and VDD2 (VSS1 and VSS2) to protect the interface circuits. To disable the current-sharing function of the inserted NMOS in the NSCR3 device between the VDD1 and VDD2, another arrangement is shown in FIG. 20, where the gate of the inserted NMOS in the NSCR3 device is connected to ground through a resistor R3. In this arrangement, both the inserted NMOS in the NSCR3 device and the inserted PMOS in the PSCR2 device are kept OFF when the IC is in the normal operating condition with the same voltage level in the VDD1 and VDD2 power lines.

Figure 21:
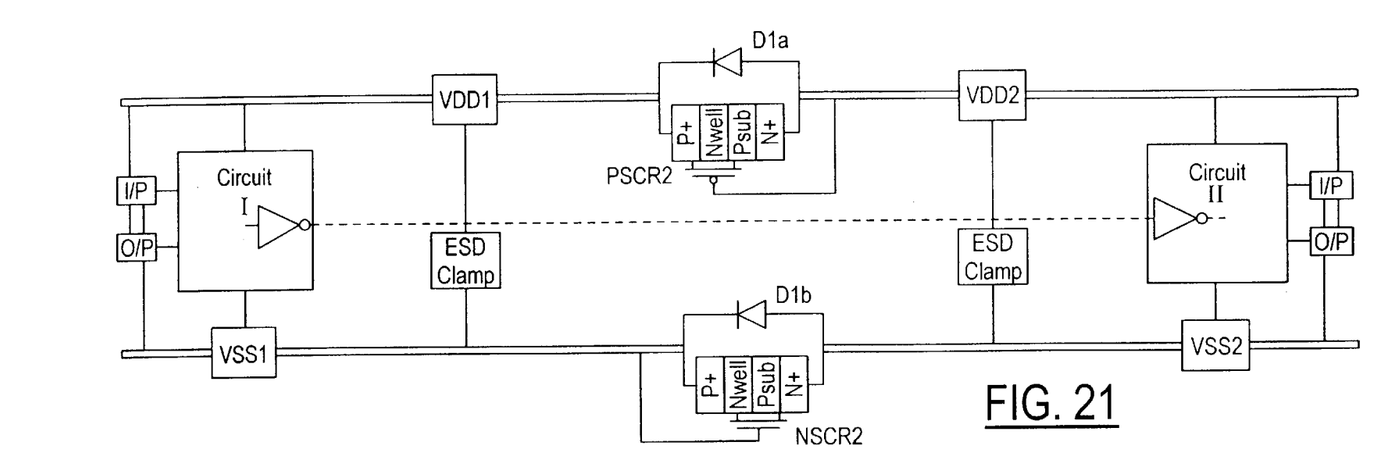
FIG. 21 is a schematic circuit diagram illustrating a circuit as in FIG. 7 with a merged arrangement wherein the PSCR1 device of FIG. 7 is replaced by the diode D1a, and the NSCR1 device is replaced by diode D1b.
Figure 22:
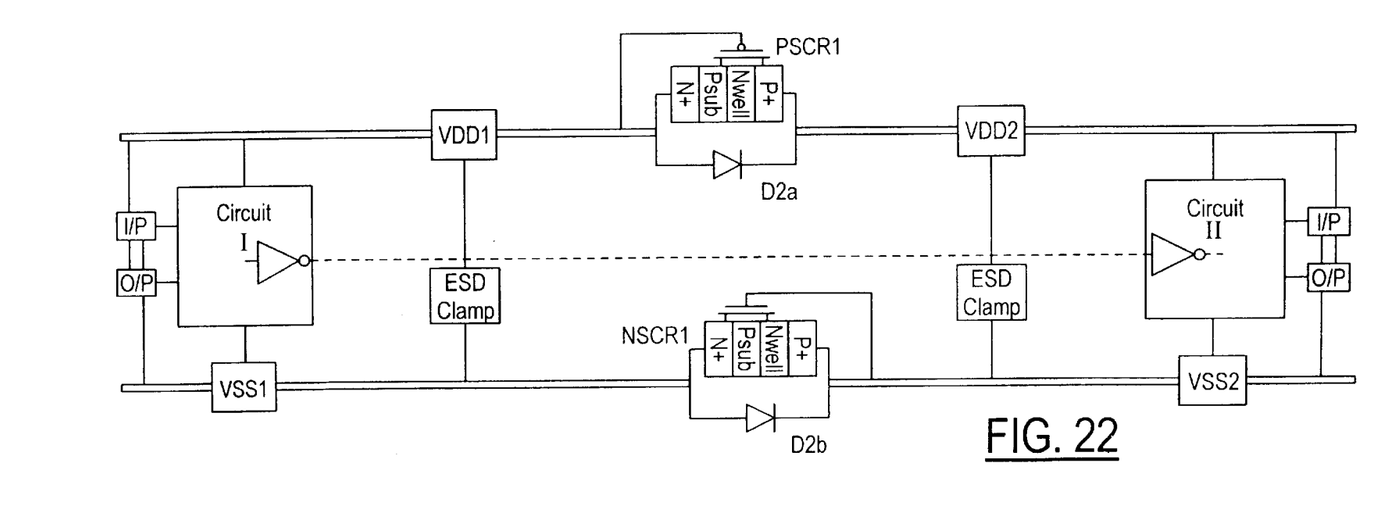
FIG. 22 is a schematic circuit diagram illustrating a circuit as in FIG. 7 with a merged arrangement wherein the PSCR2 device of FIG. 7 is replaced by the diode D2a, and the NSCR2 device is replaced by diode D2b.
Figure 23A:
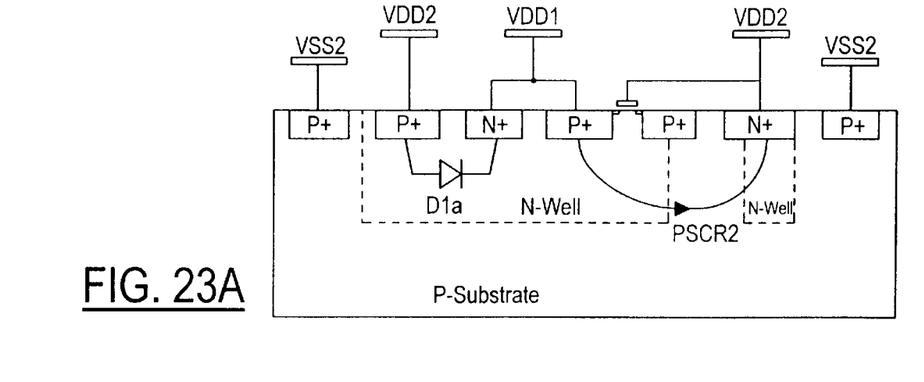
FIG. 23(a) illustrates the merged device structure of the diode D1a and PSCR2 device of FIG. 21.
Figure 23B:
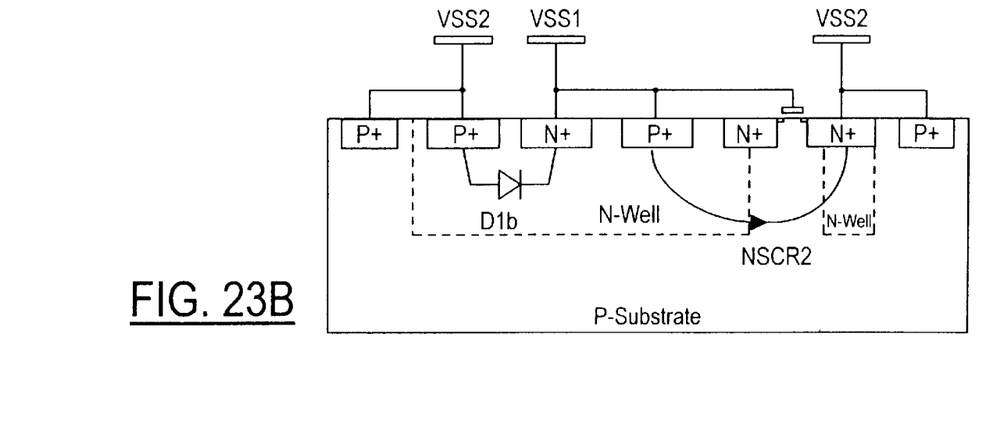
FIG. 23(b) illustrates the merged device structure of the diode D1b and NSCR2 device of FIG. 21.

The present invention can also be incorporated in prior art arrangements with diodes. Merged arrangements are shown in FIGS. 21 and 22. In the FIG. 21 arrangement, PSCR1 in FIG. 7 is replaced by the diode D1a, and NSCR1 in FIG. 7 is replaced by diode D1b. The device structure of merged diode D1a and PSCR2 is shown in FIG. 23(a), and the device structure of merged diode D1b and NSCR2 is shown in FIG. 23(b). Using the arrangement in FIG. 21 the interface circuits between the separated power lines can be effectively protected against ESD damage. In FIG. 22, the diode D2a and the PSCR1 device are used to form the bi-directional configuration for ESD protection between the separated VDD1 and VDD2 power lines, whereas diode D2b and the NSCR1 device are used to form the bi-directional configuration for ESD protection between the separated VSS1 and VSS2 power lines. The device structure of this merged arrangement is similar to those shown in FIGS. 23(a) and 23(b).

By using the bi-directional SCR devices to form the ESD-current discharging paths between the separated power lines in a CMOS IC, the ESD current can be safely discharged through the desired discharging paths without causing ESD damage in the interface circuits at the separated power lines and between the power source lines. Thus, ESD failure due to pin-to-pin ESD stress occurring on the interface circuits between the power source lines can be effectively avoided. The whole-chip ESD reliability of a CMOS IC with separated power lines can be significantly improved by the present invention with the bi-directional SCR configuration.

It will therefore be seen that a whole-chip ESD protection method and means has been provided using bi-directional SCRs to protect CMOS ICs with separated power lines against ESD damage by placing the SCRs between separated power lines of the CMOS ICs to provide ESD-current discharging paths between the lines. The ESD current is arranged to be discharged through the bi-directional SCRs and the ESD clamp devices between the power source lines. Therefore, the internal circuits and the interface circuits between the circuits with different power pins can be kept away from any ESD damage.

What is claimed is:

1. A whole-chip ESD protection circuit arrangement for protecting a CMOS IC with separated power pins against ESD damage, comprising:

first separated power lines respectively connected to said power pins in said IC;

second separated power lines respectively connected to said power pins in said IC and cooperating with said first separated power lines for providing power therebetween;

internal circuit means, connected across said first and said second separated power lines, for using power therefrom;

interface circuit means, connected across said first and said second separated power lines at the separation of said first and said second separated power lines, for using power therefrom; and bi-directional SCR means, coupled to said interface circuit means and between said first and said second separated power lines for providing ESD current discharging paths between said separated power lines to avoid ESD damage to said internal circuit means and said interface circuit means.

2. A circuit arrangement as in claim 1 wherein said IC has multiple power pins with one of said first and said second separated power lines connected thereto.

3. A circuit arrangement as in claim 1 wherein said IC has mixed-voltage power pins with one of said first and said second separated power lines connected thereto.

4. A circuit arrangement as in claim 1 wherein said bi-directional SCR means comprises an inserted PMOS device.

5. A circuit arrangement as in claim 1 wherein said bi-directional SCR means comprises an inserted NMOS device.

6. A circuit arrangement as in claim 1 wherein said bi-directional SCR means comprises an inserted PMOS device coupled between said first separated power lines and an inserted NMOS device coupled between said second separated power lines.

7. A circuit arrangement as in claim 1 wherein said bi-directional SCR means comprises an inserted PMOS device coupled between said first separated power lines and an inserted PMOS device coupled between said second separated power lines.

8. A circuit arrangement as in claim 1 wherein said bi-directional SCR means comprises an inserted NMOS device coupled between said first separated power lines and an inserted NMOS device coupled between said second separated power lines.

9. A circuit arrangement as in claim 1 wherein said bi-directional SCR means comprises two PSCR devices coupled to each other and between said first separated power lines and with the gate of one of said PSCR devices connected to one of said separated power lines and the gate of the other of said PSCR devices connected to the other of said separated power lines.

10. A circuit arrangement as in claim 1 wherein said bi-directional SCR means comprises two NSCR devices coupled to each other and between said first separated power lines and with their gates connected to ground through resistors.

11. A circuit arrangement as in claim 1 wherein said bi-directional SCR means comprises a PSCR device and an NSCR device, said devices being coupled to each other and between said first separated power lines and having their gates both connected to one of said first separated power lines.

12. A circuit arrangement as in claim 11 further comprising a second PSCR device and a second NSCR device, said devices being coupled to each other and between said second separated power lines and having their gates both connected to one of said second separated power lines.

13. A circuit arrangement as in claim 1 wherein said bi-directional SCR means comprises a PSCR device and an NSCR device, said devices being coupled to each other and between said first separated power lines and with the gate of said PSCR device connected to one of said separated power lines and the gate of said NSCR device connected to ground through a resistor.

14. A circuit arrangement as in claim 13 further comprising a second PSCR device and a second NSCR device, said devices being coupled to each other and between said second separated power lines and having their gates both connected to one of said second separated power lines.

15. A circuit arrangement as in claim 1 wherein said bi-directional SCR means comprises a PSCR device and a diode coupled to each other and between said first separated power lines and said PSCR device having its gate connected to one of said first separated power lines.

16. A circuit arrangement as in claim 15 further comprising an NSCR device and a second diode coupled to each other and between said second separated power lines and said NSCR device having its gate connected to one of said second separated power lines.

* * * * *